US012733545B2

(12) United States Patent
Lv et al.

(10) Patent No.: US 12,733,545 B2
(45) Date of Patent: Sep. 8, 2026

(54) SEMICONDUCTOR PACKAGE STRUCTURE AND MANUFACTURING METHOD THEREFOR

(71) Applicant: CHANGXIN MEMORY TECHNOLOGIES, INC., Hefei City (CN)

(72) Inventors: Kaimin Lv, Hefei (CN); Ling-Yi Chuang, Hefei (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 751 days.

(21) Appl. No.: 18/169,295

(22) Filed: Feb. 15, 2023

(65) Prior Publication Data

US 2024/0055420 A1 Feb. 15, 2024

Related U.S. Application Data

(63) Continuation of application No. PCT/CN2022/114825, filed on Aug. 25, 2022.

(30) Foreign Application Priority Data

Aug. 10, 2022 (CN) ......................... 202210956809.6

(51) Int. Cl.
*H10W 90/00* (2026.01)
*H10B 80/00* (2026.01)
(Continued)

(52) U.S. Cl.
CPC ............ *H10W 90/00* (2026.01); *H10B 80/00* (2023.02); *H10W 20/40* (2026.01); *H10W 20/42* (2026.01);
(Continued)

(58) Field of Classification Search
CPC ........... H01L 21/561; H01L 2224/1412; H01L 2224/16146; H01L 2225/06517;
(Continued)

(56) References Cited

U.S. PATENT DOCUMENTS 9,432,298 B1 8/2016 Smith
9,502,314 B2 11/2016 Tetsuji
(Continued)

FOREIGN PATENT DOCUMENTS

CN 103165586 A 6/2013
CN 103545280 A 1/2014
(Continued)

OTHER PUBLICATIONS

TW first office action in application No. 112129997, mailed on Apr. 26, 2024.

*Primary Examiner* — Shaun M Campbell
(74) *Attorney, Agent, or Firm* — Syncoda LLC; Feng Folgmann

(57) ABSTRACT

A semiconductor package structure includes: a first base plate; a first semiconductor chip connected to the first base plate; a second semiconductor chip stacking structure including at least one first chip stacking structure and at least one second chip stacking structure; and a plurality of second base plates. The first and second chip stacking structures are arranged side-by-side on the first semiconductor chip in a first direction, a plurality of second conductive bumps are formed on sides of the first and second chip stacking structure that is away from each other in the first direction, the first direction being parallel to a plane where the first base plate is located. A signal line in each second base plate is connected to the second conductive bumps. The second
(Continued)

base plates are connected to the first base plate in a direction perpendicular to the plane where the first base plate is located.

18 Claims, 5 Drawing Sheets

(51) Int. Cl.
*H10W 20/40* (2026.01)
*H10W 20/41* (2026.01)
*H10W 20/42* (2026.01)
*H10W 72/00* (2026.01)
*H10W 72/20* (2026.01)

(52) U.S. Cl.
CPC ....... *H10W 20/435* (2026.01); *H10W 72/012* (2026.01); *H10W 72/248* (2026.01)

(58) Field of Classification Search
CPC . H01L 2225/06527; H01L 2225/06541; H01L 2225/06551; H01L 2225/06558; H01L 2225/06586; H01L 23/3128; H01L 23/482; H01L 23/5226; H01L 23/5283; H01L 24/11; H01L 24/14; H01L 25/065; H01L 25/0657; H01L 25/18; H01L 25/50; H01L 2924/1436; H10B 80/00
See application file for complete search history.

(56) References Cited

U.S. PATENT DOCUMENTS 10,699,983 B2 6/2020 Kim
10,756,076 B2 8/2020 Kim
11,183,484 B2 11/2021 Okutsu et al.
2003/0052176 A1 3/2003 Nozawa
2008/0315388 A1 12/2008 Periaman
2010/0301475 A1* 12/2010 Hsu ........................ H01L 24/81 257/738
2012/0187561 A1 7/2012 Hsu
2013/0154074 A1 6/2013 Oh
2013/0341803 A1 12/2013 Cheah
2014/0015144 A1 1/2014 Kim et al.
2014/0332929 A1 11/2014 Cheng et al.
2014/0335656 A1 11/2014 Oh
2015/0037914 A1 2/2015 Takahashi et al.
2015/0041971 A1 2/2015 Lee
2016/0005718 A1 1/2016 Cheah
2017/0018530 A1 1/2017 Cheah
2018/0158764 A1 6/2018 Runyan et al.
2019/0043827 A1* 2/2019 Ito .......................... H01L 23/48
2019/0244945 A1 8/2019 Kim
2019/0295917 A1 9/2019 Kim et al.
2020/0108387 A1 4/2020 Dong et al.
2020/0144159 A1 5/2020 Chang et al.
2021/0143129 A1* 5/2021 Okutsu .................. H01L 24/92
2021/0175218 A1* 6/2021 Choi ...................... H01L 24/25
2022/0013500 A1* 1/2022 Baik ...................... H01L 24/45
2022/0173052 A1* 6/2022 Hsu .................. H01L 23/49838
2022/0189916 A1 6/2022 Jung et al.
2022/0359461 A1* 11/2022 Chang ................ H01L 25/0657

FOREIGN PATENT DOCUMENTS

CN 104347578 A 2/2015
CN 104350593 A 2/2015
CN 206727065 U 12/2017
CN 109791925 A 5/2019
CN 110120388 A 8/2019
CN 110299354 A 10/2019
CN 111244054 A 6/2020
CN 113056819 A 6/2021

* cited by examiner

SEMICONDUCTOR PACKAGE STRUCTURE AND MANUFACTURING METHOD THEREFOR

CROSS-REFERENCE TO RELATED APPLICATION

This is a continuation of International Patent Application No. PCT/CN2022/114825, filed on Aug. 25, 2022, which claims priority to Chinese Patent Application No. 202210956809.6, filed on Aug. 10, 2022. The disclosures of International Patent Application No. PCT/CN2022/114825 and Chinese Patent Application No. 202210956809.6 are hereby incorporated by reference in their entireties.

BACKGROUND

A High Bandwidth Memory (HBM) is a high-performance DRAM based on a 3D stack process. Compared with a conventional memory technology, the HBM has a higher bandwidth, more input/output (I/O) numbers, lower power consumption and smaller size, and may be applied to the fields such as high-performance computing, supercomputers, large data centers, artificial intelligence/deep learning, and cloud computing.

An HBM technology is mainly developed based on the requirements for processor computing scale. In the early days, people have low requirements for computer data processing, and processor architecture model has few layers, small computing scale and low computility. Subsequently, with the development of technologies such as artificial intelligence (AI), the requirements for the processor are higher and higher, and as the model deepens, the requirements for computility increases accordingly, resulting in bandwidth bottleneck, that is, I/O problem. In this case, the problem is resolved by means of increasing on-chip cache and optimizing a scheduling model to increase data reuse rate. However, with the popularization of technologies such as AI later, and the increase of the number of users, cloud AI processing requires multi-user, high throughput, low latency, and high-density deployment. The sharp increase of computing units has made the I/O bottleneck more serious. In this case, the emergence of the on-chip HBM makes the complete placing of AI/deep learning on chip possible, so that an integration level is increased, and at the same time the bandwidth is no longer limited by the interconnection number of chip pins. Therefore, bandwidth and computing capability bottleneck are resolved to a certain extent.

However, with the increasing requirements for the integration level of the HBM, the number of stacking layers of chips is increasing, and the technical difficulties are also increasing.

SUMMARY

The disclosure relates to the technical field of three-dimensional manufacturing processes. In view of the above, embodiments of the disclosure provide a semiconductor package structure and a manufacturing method therefor.

A first aspect of the embodiments of the disclosure provides a semiconductor package structure, including a first base plate, a first semiconductor chip, a second semiconductor chip stacking structure and a plurality of second base plates.

The first semiconductor chip is connected to the first base plate.

The second semiconductor chip stacking structure includes at least one first chip stacking structure and at least one second chip stacking structure. The first chip stacking structure and the second chip stacking structure are arranged side by side on the first semiconductor chip in a first direction. The first chip stacking structure and the second chip stacking structure each includes a plurality of second semiconductor chips that are successively stacked in the first direction. A plurality of second conductive bumps are formed on a side of each of the first chip stacking structure and the second chip stacking structure that is away from each other in the first direction. The first direction is a direction parallel to a plane where the first base plate is located.

A signal line in each of the plurality of second base plates is connected to the plurality of second conductive bumps. The plurality of second base plates are connected to the first base plate in a direction perpendicular to the plane where the first base plate is located.

A second aspect of the embodiments of the disclosure provides a method for manufacturing the semiconductor package structure. The method includes the following operations.

A second semiconductor chip stacking structure is formed. The second semiconductor chip stacking structure includes at least one first chip stacking structure and at least one second chip stacking structure. The first chip stacking structure and the second chip stacking structure include a plurality of second semiconductor chips that are successively stacked. A plurality of second conductive bumps are formed on a side of each of the first chip stacking structure and the second chip stacking structure in a stacking direction.

A first semiconductor chip is formed.

Surfaces of the first chip stacking structure and the second chip stacking structure that are away from the plurality of second conductive bumps in the stacking direction are oppositely disposed, and surfaces of the first chip stacking structure and the second chip stacking structure that are perpendicular to the stacking direction are connected to a surface of the first semiconductor chip.

A plurality of second base plates is provided. Each second base plate is located, in the stacking direction, on a side of each of the first chip stacking structure and the second chip stacking structure on which second conductive bumps are formed. A signal line in each second base plate is connected to the plurality of second conductive bumps.

A first base plate is provided, the first semiconductor chip is connected to the first base plate, and the plurality of second base plates are connected to the first base plate.

BRIEF DESCRIPTION OF THE DRAWINGS

In order to more clearly illustrate the technical solutions in the embodiments of the disclosure or in conventional technologies, the drawings required to be used in the embodiments will be briefly described below. It is apparent that the drawings in the following descriptions are merely some embodiments of the disclosure. Other drawings can be obtained by those skilled in the art according to these drawings without any creative work.

EXPLANATION OF REFERENCE NUMERALS

Figure 1:
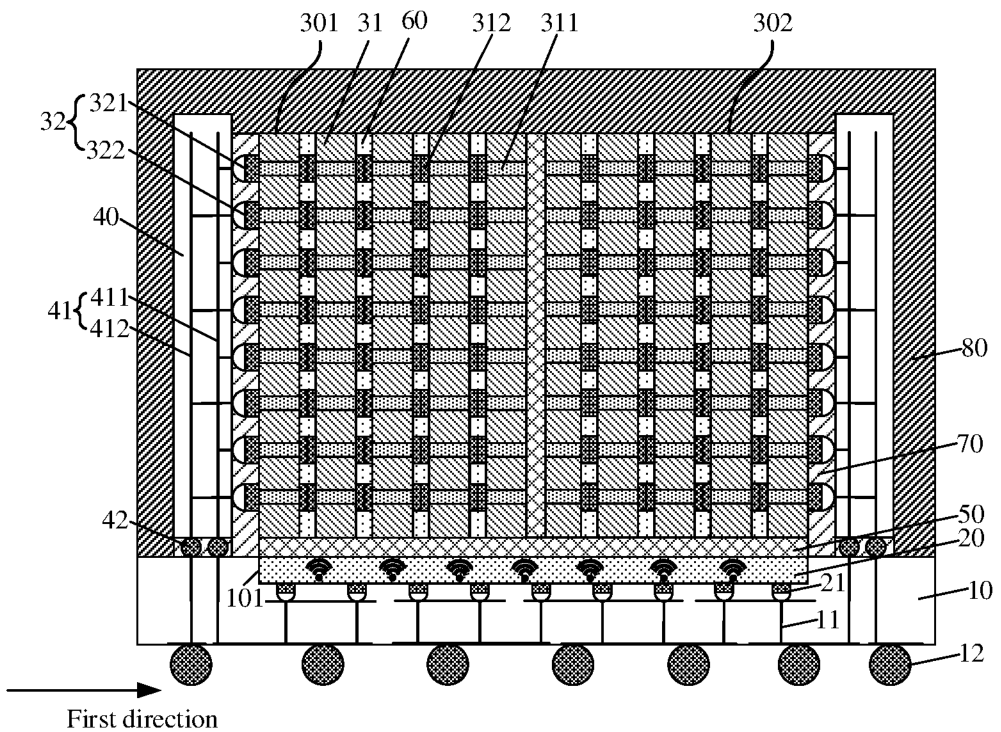
FIG. 1 is a schematic structural diagram of a semiconductor package structure according to an embodiment of the disclosure.

10—First base plate; 11—Lead; 12—Base plate connecting bump; 101—Groove;

20—First semiconductor chip; 21—First conductive bump;

301—First chip stacking structure; 302—Second chip stacking structure; 300—Second semiconductor chip stacking body; 31—Second semiconductor chip; 311—Through silicon via; 312—Fourth conductive bump; 32—Second conductive bump; 321—First conductive sub-bump; 322—Second conductive sub-bump;

40—Second base plate; 41—Signal line; 411—Ground line; 412—Power line; 42—Third conductive bump; 40'—Remaining second base plate;

50—Adhesive film;

60—Dielectric layer;

70—Filling layer;

80—Package compound structure.

DETAILED DESCRIPTION

Exemplary embodiments disclosed in the disclosure are described in more detail with reference to drawings. Although the exemplary embodiments of the disclosure are shown in the drawings, it should be understood that the disclosure may be implemented in various forms and should not be limited by the specific embodiments described here. On the contrary, these embodiments are provided for more thorough understanding of the disclosure, and to fully convey a scope disclosed in the embodiments of the disclosure to a person skilled in the art.

In the following descriptions, a lot of specific details are given in order to provide more thorough understanding of the disclosure. However, it is apparent to a person skilled in the art that the disclosure may be implemented without one or more of these details. In other examples, in order to avoid confusion with the disclosure, some technical features well-known in the field are not described. Namely, all the features of the actual embodiments are not described here, and well-known functions and structures are not described in detail.

In the drawings, the sizes of a layer, a region, and an element and their relative sizes may be exaggerated for clarity. The same reference signs represent the same elements throughout.

It should be understood that when the element or the layer is referred to as being "on", "adjacent to", "connected to" or "coupled to" other elements or layers, it may be directly on the other elements or layers, adjacent to, connected or coupled to the other elements or layers, or an intermediate element or layer may be existent. In contrast, when the element is referred to as being "directly on", "directly adjacent to", "directly connected to" or "directly coupled to" other elements or layers, the intermediate element or layer is not existent. It should be understood that although terms first, second, third and the like may be used to describe various elements, components, regions, layers and/or sections, these elements, components, regions, layers and/or sections should not be limited by these terms. These terms are only used to distinguish one element, component, region, layer or section from another element, component, region, layer or section. Therefore, without departing from the teaching of the disclosure, a first element, component, region, layer or section discussed below may be represented as a second element, component, region, layer or section. When the second element, component, region, layer or section is discussed, it does not mean that the first element, component, region, layer or section is necessarily existent in the disclosure.

Spatial relation terms, such as "under", "below", "lower", "underneath", "above", "upper" and the like, may be used here for conveniently describing so that a relationship between one element or feature shown in the drawings and other elements or features is described. It should be understood that in addition to orientations shown in the drawings, the spatial relationship terms are intended to further include the different orientations of a device in use and operation. For example, if the device in the drawings is turned over, then the elements or the features described as "below" or "underneath" or "under" other elements may be oriented "on" the other elements or features. Therefore, the exemplary terms "below" and "under" may include two orientations of up and down. The device may be otherwise oriented (e.g., rotated by 90 degrees or in other orientations) and the spatial descriptions used here are interpreted accordingly.

A purpose of the terms used here is only to describe the specific embodiments and not as limitation to the disclosure. While used here, singular forms of "a", "an" and "said/the" are also intended to include plural forms, unless the context clearly indicates another mode. It should also be understood that terms "composition" and/or "including", while used in the description, determine the existence of the described features, integers, steps, operations, elements and/or components, but do not exclude the existence or addition of one or more other features, integers, steps, operations, elements, components, and/or groups. As used herein, a term "and/or" includes any and all combinations of related items listed.

In order to understand the disclosure thoroughly, detailed steps and detailed structures are presented in the following description, so as to explain the technical solutions of the disclosure. Preferred embodiments of the disclosure are described in detail below, and however, the disclosure may also have other implementations in addition to these detailed descriptions.

An HBM technology is a main representative product that a DRAM is developed from traditional 2D to 3D, which opens a DRAM 3D road. The HBM technology mainly performs chip stacking by means of a Through silicon via (TSV) technology, so as to increase throughput and overcome bandwidth limitations within a single package, so that a plurality of DRAM dies are vertically stacked, and the dies are connected by means of the TSV technology. From a technical perspective, the HBM makes full use of space and reduces area, which is in line with the development trend of miniaturization and integration of the semiconductor industry and breaks through bottlenecks of memory capacity and bandwidth. Therefore, the HBM is regarded as a new generation DRAM solution.

During packaging of 3D integrated circuit chip (IC) products, the DRAM dies are generally stacked on a logic die by means of parallel stacking (P-Stack). With the increasing requirements for integration levels, the number of stacking layers of DRAM dies is increasing, and the technical difficulties are also increasing. For example, a communication distance between the DRAM die stacked at a high layer and the logic die at a bottom layer gets longer and longer, and the communication latency between the DRAM dies at different layers and the logic die is different due to different distances. The TSV used for communication increases in direct proportion, so that the area of a wafer is sacrificed. When unilateral power supply is used, stability is poor.

Based on this, embodiments of the disclosure provide a semiconductor package structure. FIG. 1 is a schematic structural diagram of a semiconductor package structure according to an embodiment of the disclosure.

Referring to FIG. 1, the semiconductor package structure includes a first base plate 10, a first semiconductor chip 20, a second semiconductor chip stacking structure and a plurality of second base plates 40.

The first semiconductor chip 20 is connected to the first base plate 10.

The second semiconductor chip stacking structure includes at least one first chip stacking structure 301 and at least one second chip stacking structure 302. The first chip stacking structure 301 and the second chip stacking structure 302 are arranged side by side on the first semiconductor chip 20 in a first direction. The first chip stacking structure 301 and the second chip stacking structure 302 each includes a plurality of second semiconductor chips 31 that are successively stacked in the first direction. A plurality of second conductive bumps 32 are formed on a side of each of the first chip stacking structure 301 and the second chip stacking structure 302 that is away from each other in the first direction. The first direction is a direction parallel to a plane where the first base plate 10 is located.

A signal line 41 in each second base plate 40 is connected to the plurality of second conductive bumps 32. The plurality of second base plates 40 are connected to the first base plate 10 in a direction perpendicular to the plane where the first base plate 10 is located.

In the embodiments of the disclosure, the first chip stacking structure and the second chip stacking structure are respectively connected to one second base plate, and are connected to the first base plate through respective second base plates. In this way, the first base plate may supply power for the first chip stacking structure and the second chip stacking structure, respectively. By using a manner of a two-stage base plate to supply power for the second semiconductor chip stacking structure, a power supply link can be effectively shortened, thereby reducing the voltage drop on the link. In addition, the first base plate may supply power for the first semiconductor chip in a wired manner, and perform signal exchange with the first semiconductor chip, so that the semiconductor package structure has high reliability.

In an embodiment, the first base plate 10 may be a Printed Circuit Board (PCB) or a redistribution base plate.

The first base plate 10 may include a first substrate (not shown), and a first upper insulating dielectric layer and a first lower insulating dielectric layer (not shown) that are respectively located on an upper surface and lower surface of the first base.

The first substrate may be a silicon substrate, a germanium substrate, a silicon germanium substrate, a silicon carbide substrate, a Silicon on Insulator (SOI) substrate, or a Germanium On Insulator (GOI) substrate, or may be a substrate including other element semiconductors or compound semiconductors, such as a glass substrate or a III-V compound substrates (for example, a gallium nitride substrate or a gallium arsenide substrate), or may be a laminated structure such as Si/SiGe, or may be other epitaxial structures such as SI-Ge on Insulator (SGOI).

The first upper insulating dielectric layer and the first lower insulating dielectric layer may be solder mask layers. For example, the material of the first upper insulating dielectric layer and the first lower insulating dielectric layer may be green paint.

The base plate connecting bumps 12 are formed on a lower surface of the first base plate 10. The base plate connecting bumps 12 may electrically connect the semiconductor package structure to an external apparatus, so that at least one of control signals, power signals or ground signals that are used to operate the first semiconductor chip and the second semiconductor chip may be received from the external apparatus, or data signals to be stored in the first semiconductor chip and the second semiconductor chip may be received from the external apparatus. Alternatively, data in the first semiconductor chip and the second semiconductor chip may also be provided to the external apparatus.

The base plate connecting bump 12 includes a conductive material. In the embodiment of the disclosure, the base plate connecting bump 12 is a solder ball. It is to be understood that, a shape of the base plate connecting bump provided in this embodiment of the disclosure is only an inferior and feasible specific implementation in the embodiments of the disclosure, and does not constitute a limitation of the disclosure. The base plate connecting bump may also have a structure of other shapes. The number, spacing, and location of the base plate connecting bumps are not limited to any specific arrangement, and various modifications may be made.

In an embodiment, first conductive bumps 21 are formed on a side of the first semiconductor chip 20.

A material of the first conductive bumps 21 may include at least one of aluminum, copper, nickel, tungsten, platinum, or gold.

The first semiconductor chip 20 is electrically connected to the first base plate 10 by means of the first conductive bumps 21. The first base plate 10 supplies power for the first semiconductor chip 20 in a wired manner, and performs signal exchange with the first semiconductor chip.

The first conductive bumps 21 are also connected to the base plate connecting bumps 12 by means of leads 11 in the first base plate 10. Therefore, the first semiconductor chip 20 may perform information interaction with the external apparatus by means of the base plate connecting bumps 12.

In an embodiment, as shown in FIG. 1, a groove 101 is formed in the first base plate 10. The first semiconductor chip 20 is located in the groove 101. The first semiconductor chip 20 is connected to the first base plate 10 by means of the first conductive bumps 21. The second base plate 40 is connected to the first base plate 10 by means of third conductive bumps 42.

In this embodiment, by placing the first semiconductor chip in the groove of the first base plate, a package height of the semiconductor package structure can be decreased.

Figure 2:
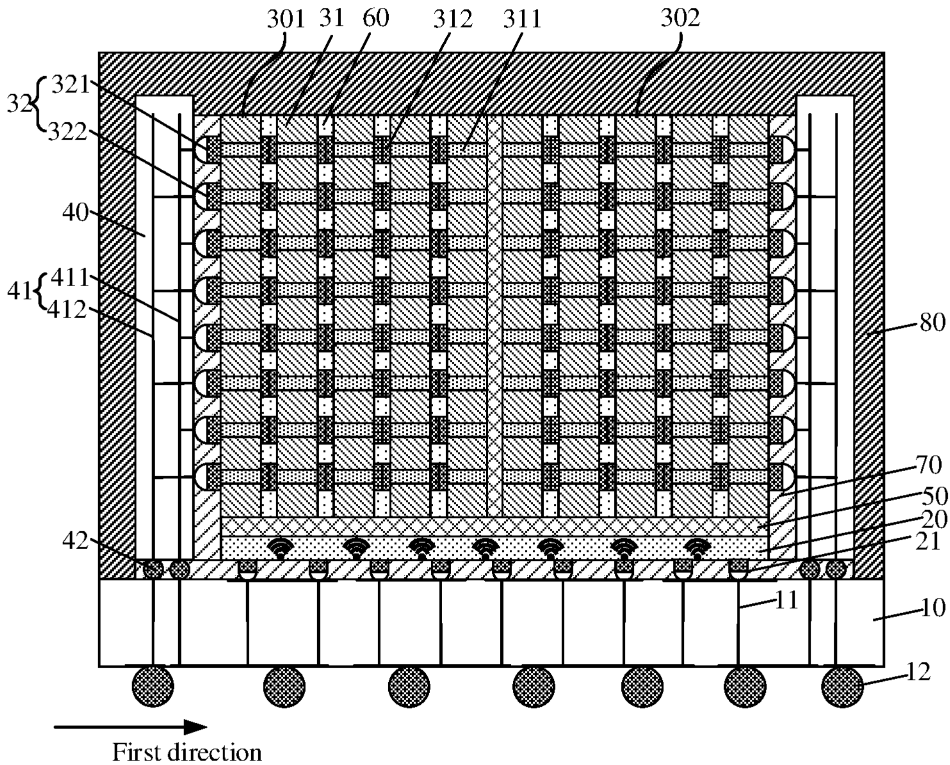
FIG. 2 is a schematic structural diagram of a semiconductor package structure according to another embodiment of the disclosure.

In another embodiment, as shown in FIG. 2, the first semiconductor chip 20 is located on the first base plate 10. The first semiconductor chip 20 is connected to the first base plate 10 by means of the first conductive bumps 21. The second base plate 40 is connected to the first base plate 10 by means of the third conductive bumps 42.

In this embodiment, the first semiconductor chip is located above the first base plate. In this way, the first base plate is not required to be provided with the groove, and thus a simpler process can be achieved. In addition, there is a gap between the first semiconductor chip and the first base plate, so that a heat dissipation effect of the first semiconductor chip can be enhanced.

There may be a plurality of stacked second semiconductor chips 31 in the first chip stacking structure 301 and in the second chip stacking structure 302. In this embodiment of the disclosure, as shown in FIG. 1 and FIG. 2, there are five stacked second semiconductor chips 31 in the first chip stacking structure 301 and five stacked second semiconductor chips 31 in the second chip stacking structure 302.

In an embodiment, as shown in FIG. 1 and FIG. 2, the stacking number of the second semiconductor chips 31 in the first chip stacking structure 301 may be the same as that in the second chip stacking structure 302. In some other embodiments, the stacking number of the second semiconductor chips in the first chip stacking structure 301 may be different from that in the second chip stacking structure 302.

In this embodiment of the disclosure, the plurality of second semiconductor chips in the first chip stacking structure and the second chip stacking structure are vertically stacked (V-Stack) on the first semiconductor chip side by side. In this way, the first semiconductor chips may communicate with the second semiconductor chips in a wireless manner, which can effectively solve the communication difficulties caused by the increasing of the number of stacking layers of the second semiconductor chips, when the plurality of second semiconductor chips are successively parallel stacked (P-Stack) on the first semiconductor chip.

In an embodiment, the first semiconductor chip 20 includes a logic die. The second semiconductor chip stacking structure includes a DRAM die.

In an embodiment, the semiconductor package structure further includes an adhesive film 50. The adhesive film 50 is located between the first semiconductor chip 20 and the second semiconductor chip stacking structure and located between the first chip stacking structure 301 and the second chip stacking structure 302.

The adhesive film can bond the first semiconductor chip and the second semiconductor chip stacking structure, and bond the first chip stacking structure and the second chip stacking structure, so as to enhance the adhesion between the first semiconductor chip and the second semiconductor chip stacking structure, and enhance the adhesion between the first chip stacking structure(s) and the second chip stacking structure, thereby improving the firmness of the semiconductor package structure. In addition, the adhesive film may adjust the distance between the second semiconductor chip stacking structure and the first semiconductor chip. That is to say, the bonding between the second base plate and the second conductive block is prevented from having an angle, resulting in extra stress to damage the second conductive block on the second semiconductor chip stacking structure.

In an embodiment, the adhesive film includes a die-bonding adhesive film.

When the adhesive film is located between the first semiconductor chip and the second semiconductor chip stacking structure, the adhesive film includes a first adhesive film and a second adhesive film (not shown) located on the first adhesive film. An elastic modulus of the second adhesive film is greater than an elastic modulus of the first adhesive film.

In the embodiment of the disclosure, as the first adhesive film is connected to the first semiconductor chip and mainly plays a role of bonding, the second adhesive film is connected to the second semiconductor chip and mainly plays a role of preventing the chip from warping, and since the second adhesive film has a relatively high elastic modulus, warping does not occur during packaging, and since the first adhesive film has a relatively low elastic modulus, the bonding between the first semiconductor chip and the second semiconductor chip stacking structure cannot be affected during the follow-up process.

In an embodiment, the first semiconductor chip 20 wirelessly communicates with the second semiconductor chip stacking structure.

Specifically, for example, a first wireless coil (not shown) is disposed in each second semiconductor chip of the second semiconductor chip stacking structure, and a second wireless coil (not shown) is disposed at a position in the first semiconductor chip that corresponds to the first wireless coil. The first semiconductor chip communicates with the second semiconductor chip stacking structure by means of the first wireless coil and the second wireless coil.

By means of the wireless communication between the first semiconductor chip and the second semiconductor chip stacking structure, the communication difficulties caused by the increasing of the number of stacking layers of the second semiconductor chips can be effectively resolved, and simultaneously the number of TSVs can be decreased, so that process difficulties can be reduced.

In an embodiment, as shown in FIG. 1, the semiconductor package structure further includes: a plurality of TSVs 311, penetrating the second semiconductor chips 31 in the first direction; and a plurality of fourth conductive bumps 312, each fourth conductive bump being located between two adjacent second semiconductor chips 31 and the plurality of fourth conductive bumps being correspondingly connected to the TSVs 311. Each of the plurality of second conductive bumps 32 is connected to respective TSVs 311 and respective fourth conductive bumps 312. For example, as shown in FIG. 1, a second conductive bump 32 is connected to two TSVs 311 and four fourth conductive bumps, as shown in FIG. 1.

In this embodiment, a power signal and a ground signal may be led to the second conductive bumps by means of the TSVs and the fourth conductive bumps subsequently.

Any two adjacent second semiconductor chips in the second semiconductor chip stacking structure are electrically connected by means of the TSVs and the fourth conductive bumps.

The second semiconductor chip stacking structure is obtained by means of hybrid bonding, so that a lower resistance value and better performance can be achieved. In addition, the stacked chip structures may be used as a whole, so that the mechanical strength of the stacked structure placed vertically can be enhanced, and the intensity of pressure on the chip can be reduced.

The semiconductor package structure further includes a dielectric layer 60. The dielectric layer is located between any two adjacent second semiconductor chips 31. Through arrangement of the dielectric layers, the two adjacent second semiconductor chips can be insulated and isolated. In addition, fourth conductive bumps are located in the dielectric layer, which enables the possibility of the coupling between the adjacent fourth conductive bumps to be reduced.

A material of the dielectric layer 60 includes an oxide. In a specific embodiment, the material of the dielectric layer 60 includes $SiO_2$.

In addition, in order to increase a thickness of the second semiconductor chip stacking structure so as to enhance its mechanical strength, thinning processing on a chip at the outermost layer is not required.

A material and structure of the second base plates 40 may be the same as those of the first base plate 10, and thus details are not described herein again.

The first chip stacking structure 301 and the second chip stacking structure 302 each is connected to a respective one of the second base plates 40, and are connected to the first base plate 10 by means of their respective second base plates 40.

In the embodiments of the disclosure, sides of the first chip stacking structure and the second chip stacking structure on which the second conductive bumps are formed are powered by means of respective second base plates. Compared with the situation that the plurality of second semiconductor chip stacking structures are powered only from one side, the problem of voltage drop caused by too many stacking layers can be better resolved, so that the performance of the second semiconductor chip stacking structure can be improved. In addition, it can be guaranteed that the first chip stacking structure has the same power supply with that of the second chip stacking structure, thereby reducing the impact of power voltage drop on the chip.

In an embodiment, the signal line 41 includes a ground line 411 and a power line 412. Each second conductive bump 32 includes a first conductive sub-bump 321 and a second conductive sub-bump 322. The ground line 411 is electrically connected to the first conductive sub-bump 321, and the power line 412 is electrically connected to the second conductive sub-bump 322.

In this embodiment, the grounding signals of the first chip stacking structure 301 and the second chip stacking structure 302 are led to the ground line 411 by means of the first conductive sub-bumps 321. The power signals of the first chip stacking structure 301 and the second chip stacking structure 302 are led to the power line 412 by means of the second conductive sub-bumps 322. Then, the ground line 411 and the power line 412 are electrically connected to the first base plate 10 by means of the third conductive bumps 42. In this way, the first base plate 10 supplies power for the first chip stacking structure 301 and the second chip stacking structure 302 by means of the third conductive bumps 42, the ground lines 411 and the power lines 412.

The third conductive bumps 42 are also connected to the base plate connecting bumps 12 by means of the leads 11 in the first base plate 10. Therefore, the first chip stacking structure 301 and the second chip stacking structure 302 may perform information interaction with the external apparatus by means of the base plate connecting bumps 12.

Figure 3:
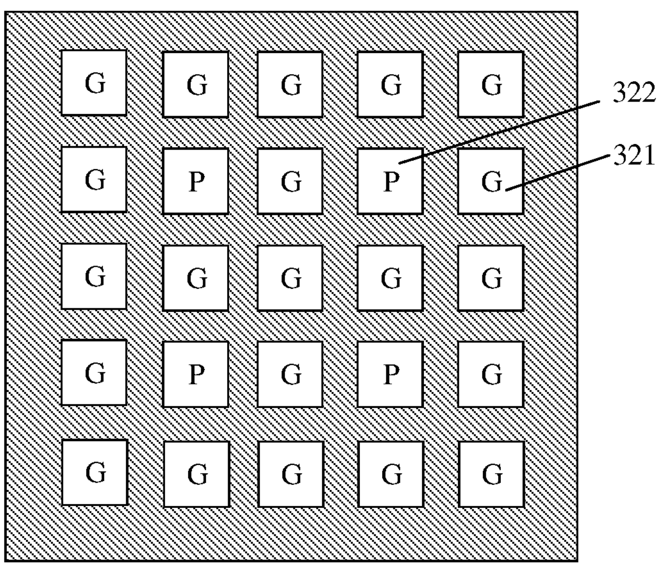
FIG. 3 is a side view of a second conductive bump in a first direction according to an embodiment of the disclosure.

FIG. 3 is a side view of a second conductive bump in a first direction according to an embodiment of the disclosure.

As shown in FIG. 3, at least one first conductive sub-bump 321 is spaced between any two adjacent second conductive sub-bumps 322; and a plurality of first conductive sub-bumps 321 surrounds the second conductive sub-bump 322.

In FIG. 3, P (Power) is the second conductive sub-bump 322, and G (Ground) is the first conductive sub-bump 321.

The first conductive sub-bumps 321 completely surround the periphery of the second conductive sub-bump 322. In addition, since the first conductive sub-bumps 321 are connected to the grounding signal and the second conductive sub-bumps 322 are connected to the power signal, crosstalk among different power signals can be reduced, and the shielding of power supplies can be enhanced.

In an embodiment, the semiconductor package structure further includes: a package compound structure 80, located on the first base plate 10. The package compound structure 80 at least wraps the first chip stacking structure 301, the second chip stacking structure 302 and the plurality of second base plates 40.

In the embodiment shown in FIG. 2, the package compound structure 80 further wraps the first semiconductor chip 20.

The package compound structure 80 includes a silicon-containing compound. The silicon-containing compound may be Spin On Glass (SOG), silicon-containing Spin On Dielectric (SOD) or other silicon-containing spin on materials.

By means of forming the package compound structure 80, and since the material of the package compound structure 80 includes the silicon-containing compound, the warping problem of the second semiconductor chip stacking structure can be alleviated.

The semiconductor package structure further includes a filling layer 70. The filling layer is located between the second semiconductor chip stacking structure and each of the plurality of second base plates 40, and/or located between the first semiconductor chip 20 and the first base plate 10.

In an embodiment, the filling layer 70 may further be located between the first base plate 10 and the second base plate 40.

For example, in an embodiment, as shown in FIG. 1, when the first semiconductor chip 20 is located in the groove of the first base plate 10, the filling layer 70 may be located between the first and second chip stacking structure 301, 302 and their respective second base plate 40, and/or located between the second base plate 40 and the first base plate 10.

In another embodiment, as shown in FIG. 2, when the first semiconductor chip 20 is located above the first base plate 10, the filling layer 70 may be located between the first semiconductor chip 20 and the first base plate 10, and/or located between the second base plate 40 and the first base plate 10, and/or located between the first and second chip stacking structure 301, 302 and their respective second base plate 40.

For the three-dimensional stacked second semiconductor chip stacking structure, since its thickness in the first direction is relatively thin, the warping degree of the second semiconductor chip stacking structure is relatively high, and when the second semiconductor chip stacking structure stands on the first semiconductor chip, it is difficult to weld the second semiconductor chip stacking structure and the second base plates due to high warping degree. Therefore, the filling layer is disposed between the second semiconductor chip stacking structure and the second base plates, and between the first base plate and the first semiconductor chip, so that the impact caused by the mismatching of expansion characteristics of overall temperature between the chip and the base plates or caused by external force can be effectively reduced, thereby improving the reliability of the semiconductor package structure.

In an embodiment, a material of the filling layer 70 includes epoxy.

By means of a capillarity principle, the epoxy may be smeared at an edge of the chip to allow the epoxy to permeate to the bottom of the chip or the base plate, and then the epoxy is heated to be cured. Since the epoxy can effectively enhance the mechanical strength of welding spots, the service life of the chip can be prolonged.

In an embodiment, a Young's modulus of the filling layer 70 is greater than a Young's modulus of the package compound structure 80.

The Young's modulus is a physical quantity that can describe the capability of a solid material to resist deformation. When the Young's modulus is higher, the capability for resisting deformation is greater. When the Young's modulus is too low, the rigidity of the package structure is difficult to maintain, easily causing problems such as deformation, warping or damage. Therefore, in the embodiment of the disclosure, the filling layer is formed, and the Young's modulus of the filling layer is greater than the Young's modulus of the package compound structure. In this way, the filling layer can have enough strength to support the entire package structure, so that the package structure is not easy to deform, warp or damage.

Figure 4:
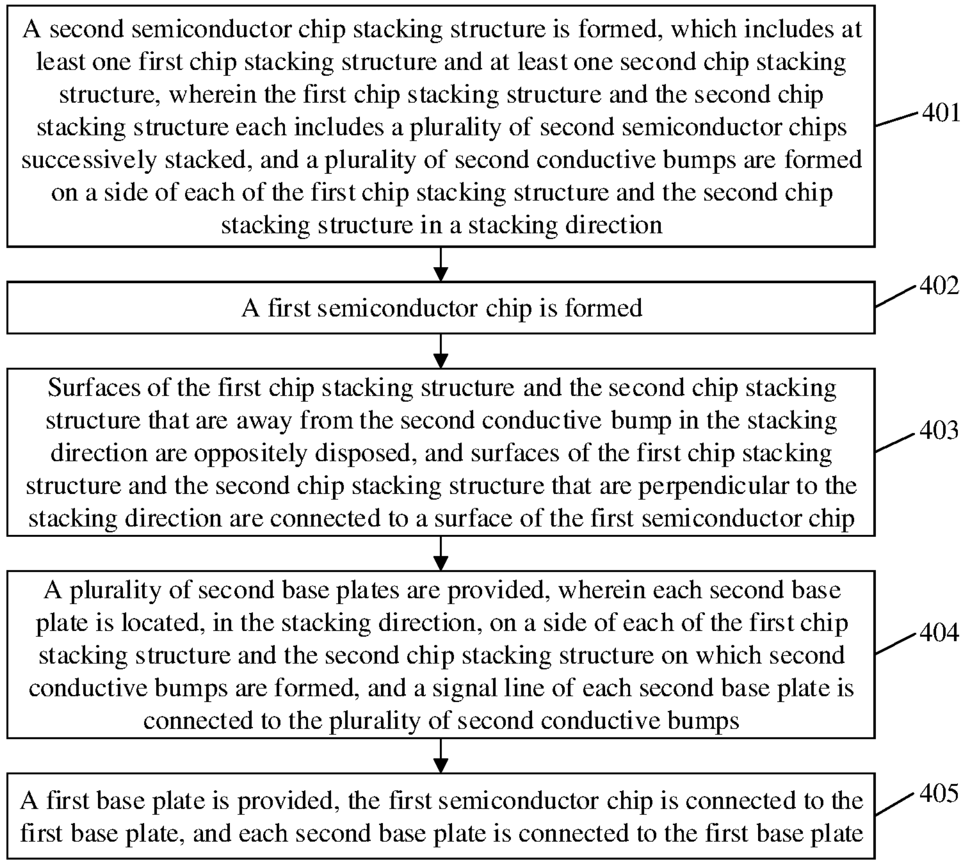
FIG. 4 is a schematic flowchart of a method for manufacturing a semiconductor package structure according to an embodiment of the disclosure.

An embodiment of the disclosure further provides a method for manufacturing the semiconductor package structure described in any one of the above embodiments, which is described in FIG. 4 for details. As shown in the FIG. 4, the method includes the following operations S401, S402, S403, S404, S405.

At S401, a second semiconductor chip stacking structure is formed. The second semiconductor chip stacking structure includes at least one first chip stacking structure and at least one second chip stacking structure. The first chip stacking structure and the second chip stacking structure include a plurality of second semiconductor chips that are successively stacked. A plurality of second conductive bumps are formed on a side of each of the first chip stacking structure and the second chip stacking structure in a stacking direction.

At S402, a first semiconductor chip is formed.

At S403, surfaces of the first chip stacking structure and the second chip stacking structure that are away from the plurality of second conductive bumps in the stacking direction are oppositely disposed, and surfaces of the first chip stacking structure and the second chip stacking structure that are perpendicular to the stacking direction are connected to a surface of the first semiconductor chip.

At S404, a plurality of second base plates is provided. Each second base plate is located, in the stacking direction, on a side of each the first chip stacking structure and the second chip stacking structure on which second conductive bumps are formed. A signal line in each of the second base plates is connected to the second conductive bumps.

At S405, a first base plate is provided, the first semiconductor chip is connected to the first base plate, and the plurality of second base plates are connected to the first base plate.

The method for manufacturing a semiconductor package structure provided in the embodiments of the disclosure is further described in detail below with reference to specific embodiments.

FIG. 5A to FIG. 5G are schematic diagrams of a device structure of a semiconductor package structure during manufacturing according to an embodiment of the disclosure.

Figure 5A:
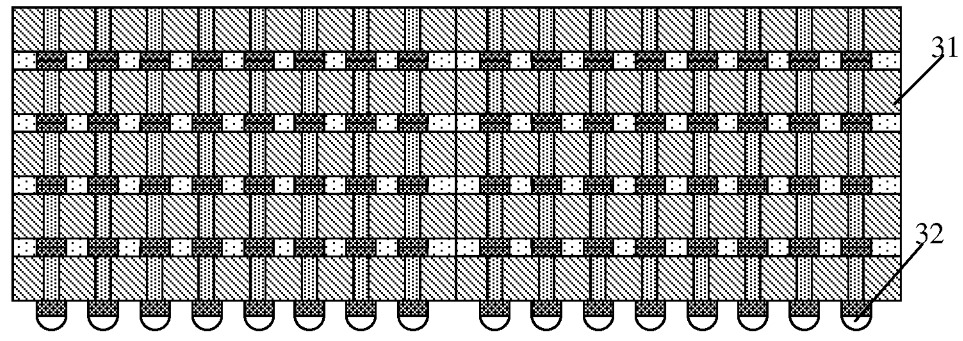
FIG. 5A to FIG. 5G are schematic diagrams of a device structure of a semiconductor package structure during manufacturing according to an embodiment of the disclosure.
Figure 5B:
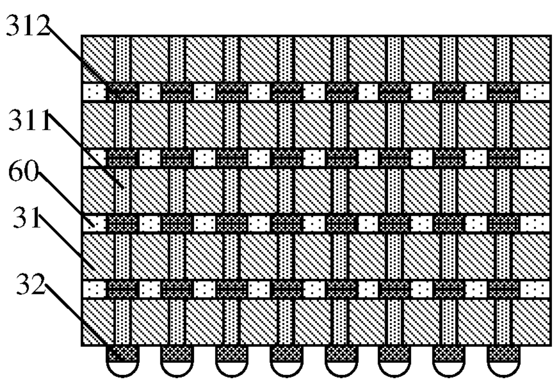

First, referring to FIG. 5A and FIG. 5B, S401 is executed. The second semiconductor chip stacking structure is formed. The second semiconductor chip stacking structure includes at least one first chip stacking structure and at least one second chip stacking structure. The first chip stacking structure and the second chip stacking structure each includes a plurality of second semiconductor chips 31 that are successively stacked. The plurality of second conductive bumps 32 are formed on the a side of each of the first chip stacking structure and the second chip stacking structure in the stacking direction.

Referring to FIG. 5A, the operation that the second semiconductor chip stacking structure is formed includes the following operations. A plurality of TSVs 311 penetrating the plurality of second semiconductor chips 31 are formed in the stacking direction.

A fourth conductive bump 312 is formed between any two adjacent second semiconductor chips of the plurality of second semiconductor chips 31. A plurality of fourth conductive bumps 312 is correspondingly connected to the TSVs 311.

The plurality of second semiconductor chips 31 are connected by means of hybrid bonding to form a second semiconductor chip stacking body 300.

The second semiconductor chip stacking body 300 is formed into a plurality of second semiconductor chip stacking structures.

In an embodiment, the second semiconductor chip stacking structure includes a DRAM die.

In an actual operation, the second semiconductor chip stacking body may be cut to form a plurality of second semiconductor chip stacking structures.

There may be a plurality of stacked second semiconductor chips 31 in the second semiconductor chip stacking structure. In an embodiment of the disclosure, as shown in FIG. 5B, the stacking number of the second semiconductor chips 31 in the second semiconductor chip stacking structure is five.

In an embodiment, as shown in FIG. 5A, the second conductive bumps 32 may be located on the second semiconductor chip 31 at the bottom layer of the second semiconductor chip stacking body 300. In other embodiments, the second conductive bumps 32 may also be located on the second semiconductor chip 31 at the topmost layer of the second semiconductor chip stacking body 300.

FIG. 5B only shows one second semiconductor chip stacking structure. However, it may be understood that the structural compositions of the first chip stacking structure and the second chip stacking structure are identical.

Continuously referring to FIG. 5B, the method for manufacturing a semiconductor package structure further includes: forming a dielectric layer 60 between any two adjacent second semiconductor chips of the plurality of the second semiconductor chips 31. Through arrangement of the dielectric layers, the two adjacent second semiconductor chips can be insulated and isolated. In addition, the fourth conductive bump is located in the dielectric layer, which enables the possibility of the coupling between the adjacent fourth conductive bumps can be reduced.

A material of the dielectric layer 60 includes an oxide. In a specific embodiment, the material of the dielectric layer 60 includes $SiO_2$.

In addition, in order to increase a thickness of the second semiconductor chip stacking structure so as to enhance its mechanical strength, thinning processing on a chip at the outermost layer is not required.

Figure 5C:
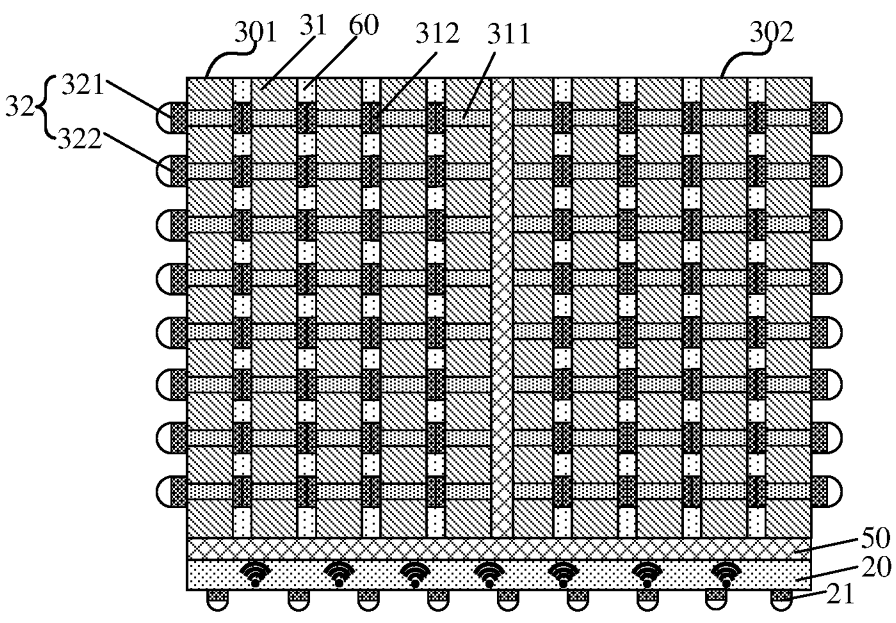

Next, referring to FIG. 5C, S402 and S403 are executed. The first semiconductor chip 20 is formed.

The surfaces of the first chip stacking structure 301 and the second chip stacking structure 302 that are away from the plurality of second conductive bumps 32 in the stacking direction are oppositely disposed, and the surfaces of the first chip stacking structure 301 and the second chip stacking structure 302 that are perpendicular to the stacking direction are connected to the surface of the first semiconductor chip 20.

In some embodiments, if the stacking direction is a direction perpendicular to the plane where the first semiconductor chip is located, the first chip stacking structure

301 and the second chip stacking structure 302 are connected to the first semiconductor chip by rotating 90 degrees.

In some other embodiments, if the stacking direction is a direction parallel to the plane where the first semiconductor chip is located, it is unnecessary to rotate the first chip stacking structure 301 and the second chip stacking structure 302.

In an embodiment, the first semiconductor chip 20 includes a logic die.

In an embodiment, the method further includes: forming first conductive bumps 21 on a surface of a side of the first semiconductor chip 20. The first chip stacking structure 301 and the second chip stacking structure 302 are connected to the surface of the first semiconductor chip 20 that is away from the first conductive bumps 21.

In an embodiment, the method further includes the following operations. An adhesive film 50 is formed. By means of the adhesive film 50, the second semiconductor chip stacking structure 30 is connected the first semiconductor chip 20 are connected, and the first chip stacking structure 301 and the second chip stacking structure 302 are connected.

The adhesive film can bond the first semiconductor chip and the second semiconductor chip stacking structure, and bond the first chip stacking structure and the second chip stacking structure, so as to enhance the adhesion between the first semiconductor chip and the second semiconductor chip stacking structure, and enhance the adhesion between the first chip stacking structure and the second chip stacking structure, thereby improving the firmness of the semiconductor package structure. In addition, the adhesive film may adjust the distance between the second semiconductor chip stacking structure and the first semiconductor chip. That is to say, the bonding between the second base plate and the second conductive block is prevented from having an angle, resulting in extra stress to damage the second conductive block on the second semiconductor chip stacking structure.

In an embodiment, the adhesive film includes a die-bonding adhesive film.

When the adhesive film is located between the first semiconductor chip and the second semiconductor chip stacking structure, the adhesive film includes a first adhesive film and a second adhesive film (not shown) located on the first adhesive film. An elastic modulus of the second adhesive film is greater than an elastic modulus of the first adhesive film.

In the embodiment of the disclosure, as the first adhesive film is connected to the first semiconductor chip and mainly plays a role of bonding, and the second adhesive film is connected to the second semiconductor chip and mainly plays a role of preventing the chip from warping, and since the second adhesive film has a relatively high elastic modulus, warping does not occur during packaging, and since the first adhesive film has relatively low elastic modulus, the bonding between the first semiconductor chip and the second semiconductor chip stacking structure cannot be affected during the follow-up process.

In an embodiment, the first semiconductor chip 20 wirelessly communicates with the second semiconductor chip stacking structure.

Specifically, for example, a first wireless coil (not shown) is disposed in each of the second semiconductor chips in the second semiconductor chip stacking structure, and a second wireless coil (not shown) is disposed at a position in the first semiconductor chip that corresponds to the first wireless coil. The first semiconductor chip communicates with the second semiconductor chip stacking structure by means of the first wireless coil and the second wireless coil.

By means of the wireless communication between the first semiconductor chip and the second semiconductor chip stacking structure, the communication difficulties caused by increasing of the number of stacking layers of the second semiconductor chips can be effectively resolved, and simultaneously the number of TSVs can be decreased, so that process difficulties can be reduced.

Figure 5D:
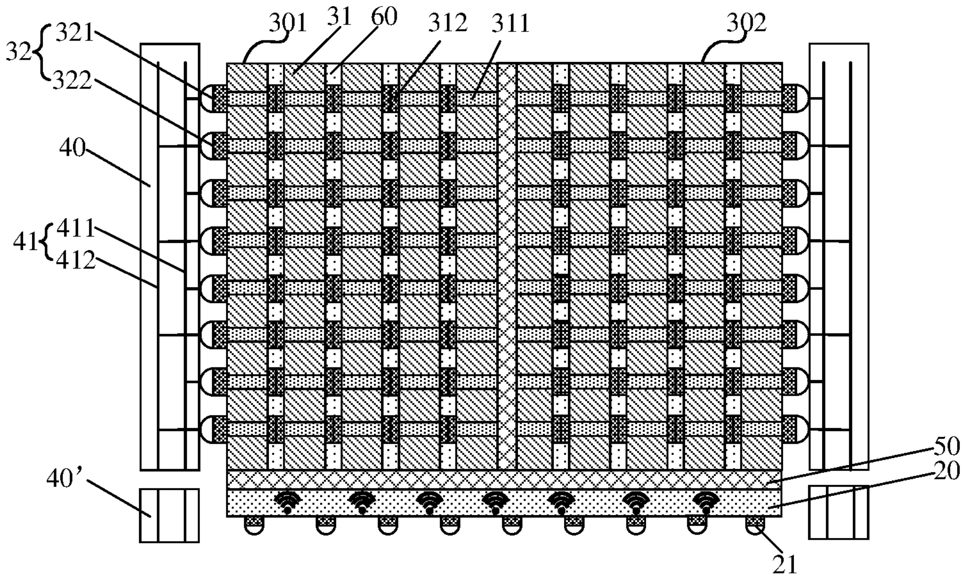
Figure 5E:
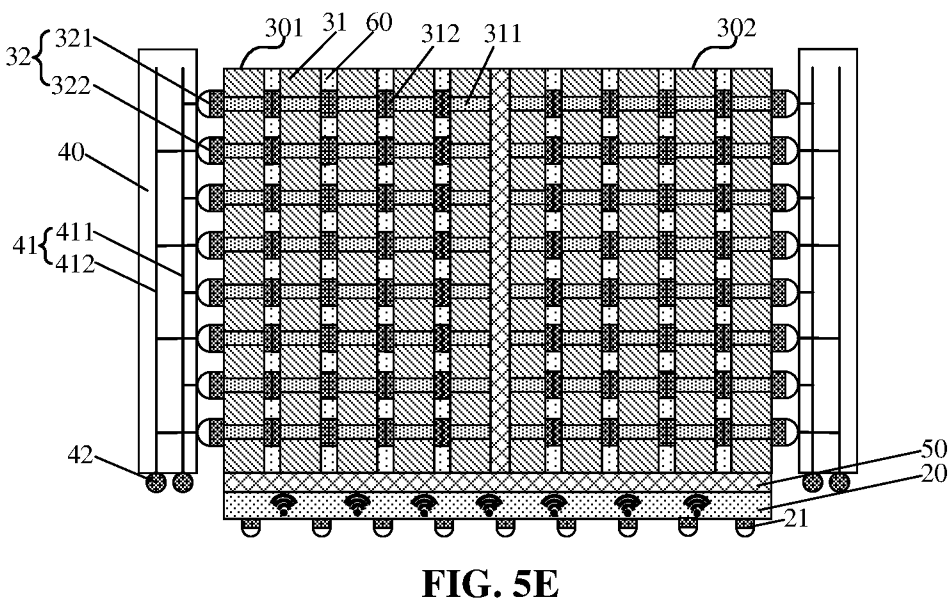

Next, referring to FIG. 5D and FIG. 5E, S404 is executed. A plurality of second base plates 40 is provided. Each second base plate 40 is located, in the stacking direction, on a side of each of the first chip stacking structure 301 and the second chip stacking structure 302 on which second conductive bumps 32 are formed. A signal line 41 in each of the second base plates 40 is connected to the plurality of second conductive bumps 32.

Referring to FIG. 5D and FIG. 5E, the operation of providing the plurality of second base plates 40 includes the following operation.

Each of the plurality of second base plates 40 is cut to form third conductive bumps 42 on the second base plate 40, and a surface of the second base plate 40 on which the third conductive bumps 42 are formed to be flush with a surface of the second semiconductor chip stacking structure that is close to the first semiconductor chip 20.

Specifically, the second conductive bumps 32 of the first chip stacking structure 301 and the second conductive bumps 32 of the second chip stacking structure 302 are respectively welded with one second base plate 40; then the second base plate 40 is cut to an appropriate size, for example, the second base plate is cut to be flush with the surfaces of the first chip stacking structure 301 and the second chip stacking structure 302 that are close to the first semiconductor chip 20, and exposes the signal lines 41; and then the remaining second base plate 40' is removed.

In the embodiment of the disclosure, sides of the first chip stacking structure and the second chip stacking structure on which the second conductive bumps are formed are powered by means of their respective second base plates. Compared with the situation that the plurality of second semiconductor chip stacking structures are powered only from one side, the problem of voltage drop caused by too many stacking layers can be better resolved, so that the performance of the second semiconductor chip stacking structure can be improved. In addition, it can be guaranteed that the first chip stacking structure has the same power supply with that of the second chip stacking structure, thereby reducing the impact of power voltage drop on the chip.

It is to be noted that, in the embodiment shown in FIG. 5D, the surface of the second base plate 40 on which the third conductive bumps 42 are formed is flush with the surface of each of the first chip stacking structure 301 and the second chip stacking structure 302 that is close to the first semiconductor chip 20. In the embodiment of forming the semiconductor package structure shown in FIG. 2, the surface of the second base plate 40 on which the third conductive bump 42 is formed is flush with the surface of the first semiconductor chip 20 on which the first conductive bumps 21 is formed.

Next, referring to FIG. 5E, the third conductive bumps 42 are formed on the surface of the cut second base plate 40 that exposes the signal line 41. The third conductive bumps 42 are connected to the signal line 41.

In an embodiment, the signal line 41 includes a ground line 411 and a power line 412. Each second conductive bump 32 includes a first conductive sub-bump 321 and a second conductive sub-bump 322. The ground line 411 is electrically connected to the first conductive sub-bump(s) 321, and the power line 412 is electrically connected to the second conductive sub-bump 322(*s*).

In this embodiment, the grounding signals of the first chip stacking structure 301 and the second chip stacking structure 302 are led to the ground line 411 by means of the first conductive sub-bumps 321. The power signals of the first chip stacking structure 301 and the second chip stacking structure 302 are led to the power line 412 by means of the second conductive sub-bumps 322. Then, the ground line 411 and the power line 412 are electrically connected to the first base plate 10 by means of the third conductive bumps 42. Therefore, the first base plate 10 supplies power for the first chip stacking structure 301 and the second chip stacking structure 302 by means of the third conductive bumps 42, the ground lines 411 and the power lines 412.

The third conductive bumps 42 are also connected to the base plate connecting bumps 12 by means of the lead 11 in the first base plate 10. In this way, the first chip stacking structure 301 and the second chip stacking structure 302 may achieve information interaction with the external apparatus by means of the base plate connecting bumps 12.

FIG. 3 is a side view of a second conductive bump in a first direction according to an embodiment of the disclosure.

As shown in FIG. 3, at least one first conductive sub-bump 321 is spaced between any two adjacent second conductive sub-bumps 322; and the first conductive sub-bumps 321 surround the second conductive sub-bumps 322.

In FIG. 3, P (Power) is the second conductive sub-bump 322, and G (Ground) is the first conductive sub-bump 321.

A plurality of first conductive sub-bumps 321 completely surrounds the periphery of a second conductive sub-bump 322. In addition, since the first conductive sub-bumps 321 are connected to the grounding signal and the second conductive sub-bumps 322 are connected to the power signal, crosstalk among different power signals can be reduced, and the shielding of power supplies can be enhanced.

Figure 5F:
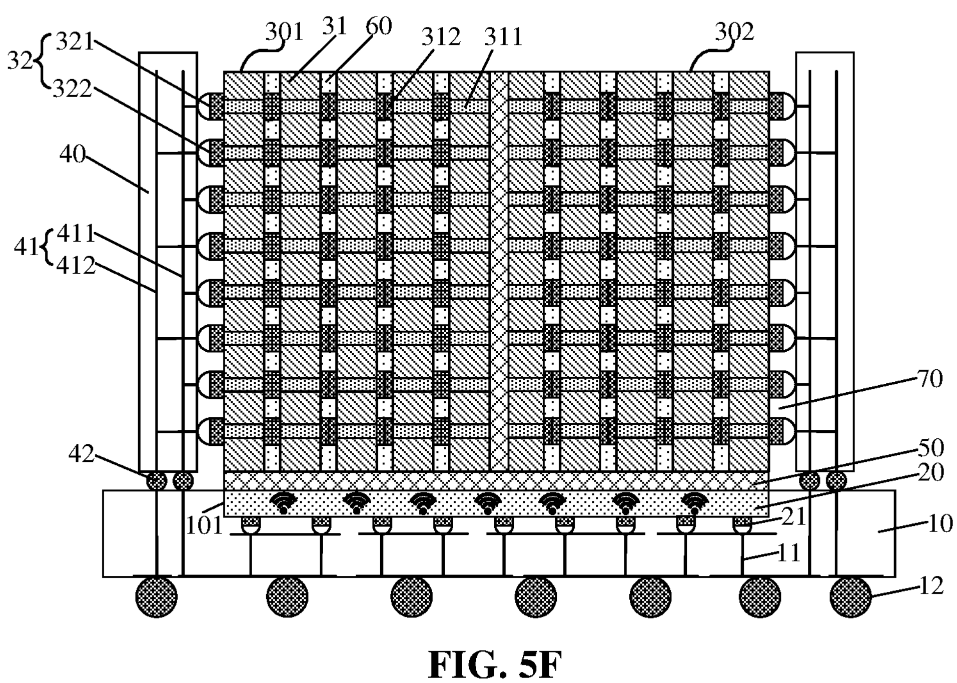

Next, referring to FIG. 5F, S405 is executed. A first base plate 10 is provided, the first semiconductor chip 20 is connected to the first base plate 10, and the plurality of second base plates 40 are connected to the first base plate 10.

In an embodiment, the first base plate 10 may be a PCB or a redistribution base plate.

The first base plate 10 may include a first substrate (not shown), and a first upper insulating dielectric layer and a first lower insulating dielectric layer (not shown) that are respectively located on an upper surface and lower surface of the first substrate.

The first substrate may be a silicon substrate, a germanium substrate, a silicon germanium substrate, a silicon carbide substrate, an SOI substrate, or a GOI substrate, or may be a substrate including other element semiconductors or compound semiconductors, such as a glass substrate or a III-V compound substrates (for example, a gallium nitride substrate or a gallium arsenide substrate), or may be a laminated structure such as Si/SiGe, or may be other epitaxial structures such as SGOI.

The first upper insulating dielectric layer and the first lower insulating dielectric layer may be solder mask layers. For example, materials of the first upper insulating dielectric layer and the first lower insulating dielectric layer may be green paint.

Base plate connecting bumps 12 are formed on a lower surface of the first base plate 10. The base plate connecting bumps 12 may electrically connect the semiconductor package structure to an external apparatus, so that at least one of control signals, power signals or grounding signals that are used to operate the first semiconductor chip and the second semiconductor chip may be received from the external apparatus, or data signals to be stored in the first semiconductor chip and the second semiconductor chip may be received from the external apparatus. Alternatively, data in the first semiconductor chip and the second semiconductor chip may also be provided to the external apparatus.

The base plate connecting bump 12 includes a conductive material. In the embodiment of the disclosure, the base plate connecting bump 12 is a solder ball. It is understandable that a shape of the base plate connecting bump provided in this embodiment of the disclosure is only an inferior and feasible specific implementation in the embodiments of the disclosure, and does not constitute a limitation of the disclosure. The base plate connecting bump may also have a structure of other shapes. The number, spacing, and location of the base plate connecting bumps are not limited to any specific arrangement, and various modifications may be made.

In an embodiment, specifically, the first semiconductor chip 20 is connected to the first base plate 10 by means of the first conductive bumps 21; and each of the plurality of second base plates 40 is connected to the first base plate 10 by means of third conductive bumps 42.

In an embodiment, as shown in FIG. 5F, a groove 101 is formed in the first base plate 10. The first semiconductor chip 20 is placed in the groove 101.

In this embodiment, by placing the first semiconductor chip in the groove of the first base plate, a package height of the semiconductor package structure can be decreased.

In some other embodiments, as shown in FIG. 2, the first semiconductor chip 20 is located on the first base plate 10. The first conductive bumps 21 are located between the first semiconductor chip 20 and the first base plate 10.

In this embodiment, the first semiconductor chip is located above the first base plate. In this way, the first base plate is not required to be provided with the groove, and thus a simpler process can be achieved. In addition, there is a gap between the first semiconductor chip and the first base plate, so that a heat dissipation effect of the first semiconductor chip can be enhanced.

The first semiconductor chip 20 is electrically connected to the first base plate 10 through the first conductive bumps 21. The first base plate 10 supplies power for the first semiconductor chip in a wired manner, and performs signal exchange with the first semiconductor chip.

The first conductive bumps 21 are also connected to the base plate connecting bumps 12 by means of a lead 11 in the first base plate 10. Therefore, the first semiconductor chip 20 may perform information interaction with the external apparatus by means of the base plate connecting bumps 12.

The third conductive bumps 42 are also connected to the base plate connecting bumps 12 by means of leads 11 in the first base plate 10. Therefore, the second semiconductor chip stacking structure may perform information interaction with the external apparatus by means of the base plate connecting bumps 12.

Figure 5G:
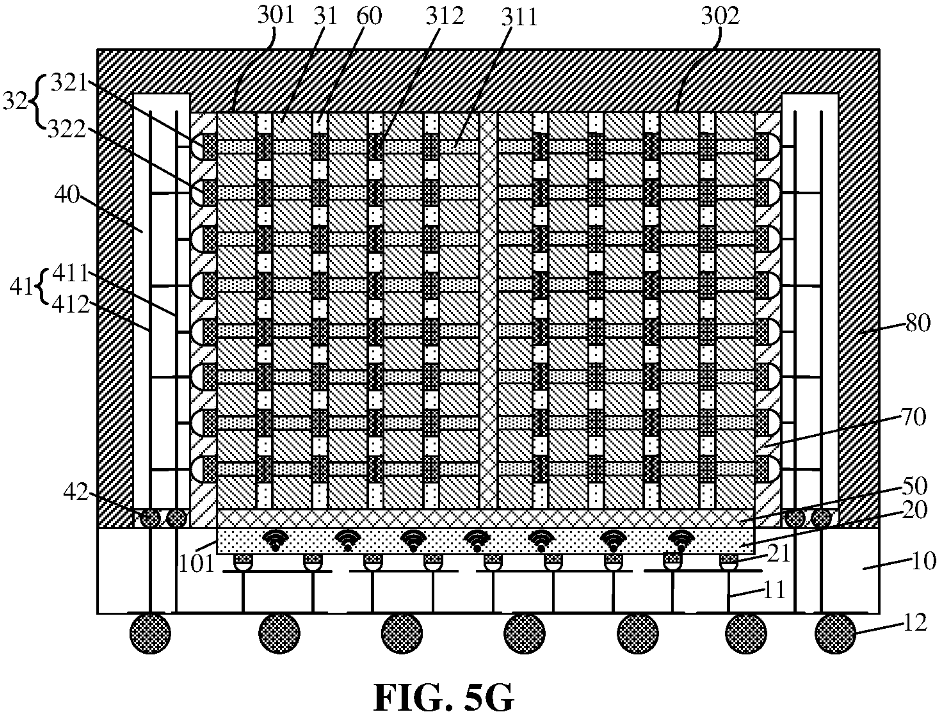

Next, referring to FIG. 5G, the method further includes: forming a package compound structure 80 on the first base plate 10. The package compound structure 80 at least wraps the first chip stacking structure 301, the second chip stacking structure 302 and the second base plates 40.

In the embodiment shown in FIG. 2, the package compound structure 80 further wraps the first semiconductor chip 20.

The package compound structure 80 includes a silicon-containing compound. The silicon-containing compound may be SOG, silicon-containing SOD or other silicon-containing spin on materials.

By means of forming the package compound structure 80, and since the material of the package compound structure 80 includes the silicon-containing compound, the warping problem of the second semiconductor chip stacking structure can be alleviated.

Next, the method further includes: forming a filling layer 70. The filling layer 70 is located between the second semiconductor chip stacking structure and each of the second base plates 40, and/or located between the first semiconductor chip 20 and the first base plate 10.

In an embodiment, the filling layer 70 may further be located between the first base plate 10 and the second base plate 40.

For example, in an embodiment, as shown in FIG. 5G, when the first semiconductor chip 20 is located in the groove of the first base plate 10, the filling layer 70 may be located between the first and second chip stacking structure 301, 302 and their respective second base plate 40, and/or located between the second base plate 40 and the first base plate 10.

In another embodiment, as shown in FIG. 2, when the first semiconductor chip 20 is located above the first base plate 10, the filling layer 70 may be located between the first semiconductor chip 20 and the first base plate 10, and/or located between the second base plate 40 and the first base plate 10, and/or located between the first and second chip stacking structure 301, 302 and their respective second base plate 40.

For the three-dimensional stacked second semiconductor chip stacking structure, since its thickness in the first direction is relatively thin, the warping degree of the second semiconductor chip stacking structure is relatively high, and when the second semiconductor chip stacking structure stands on the first semiconductor chip, it is difficult to weld the second semiconductor chip stacking structure and the second base plate due to high warping degree. Therefore, the filling layer is disposed between the second semiconductor chip stacking structure and the second base plates, and between the first base plate and the first semiconductor chip, so that the impact caused by the mismatching of expansion characteristics of overall temperature between the chip and the base plate or caused by external force can be effectively reduced, thereby improving the reliability of the semiconductor package structure.

In an embodiment, a material of the filling layer 70 includes epoxy.

By means of a capillarity principle, the epoxy may be smeared at an edge of the chip to allow the epoxy to permeate to the bottom of the chip or the base plate, and then the epoxy is heated to be cured. Since the epoxy can effectively enhance the mechanical strength of welding spots, the service life of the chip can be prolonged.

In an embodiment, a Young's modulus of the filling layer 70 is greater than a Young's modulus of the package compound structure 80.

The Young's modulus is a physical quantity that can describe the capability of a solid material to resist deformation. When the Young's modulus is higher, the capability for deformation resistance is greater. When the Young's modulus is too low, the rigidity of the package structure is difficult to maintain, easily causing problems such as deformation, warping or damage. Therefore, in the embodiment of the disclosure, the filling layer is formed, and the Young's modulus of the filling layer is greater than the Young's modulus of the package compound structure. In this way, the filling layer can have enough strength to support the entire package structure, so that the package structure is not easy to deform, warp or damage.

The above are only preferred embodiments of the disclosure, and are not used to limit the scope of protection of the disclosure. Any modifications, equivalent replacements and improvements and the like made within the spirit and principle of the disclosure shall be included within the scope of protection of the disclosure.

INDUSTRIAL APPLICABILITY

In the embodiments of the disclosure, the first chip stacking structure and the second chip stacking structure are respectively connected to a second base plate, and are connected to the first base plate by means of the second base plate. In this way, the first base plate may supply power for the first chip stacking structure and the second chip stacking structure, respectively. By using a manner of a two-stage base plate to supply power for the second semiconductor chip stacking structure, a power supply link can be effectively shortened, thereby reducing the voltage drop on the link. In addition, the first base plate may supply power for the first semiconductor chip in a wired manner, and perform signal exchange with the first semiconductor chip, so that the semiconductor package structure has high reliability.

The invention claimed is:

1. A semiconductor package structure, comprising:

a first base plate;

a first semiconductor chip, connected to the first base plate;

a second semiconductor chip stacking structure, comprising at least one first chip stacking structure and at least one second chip stacking structure, wherein the first chip stacking structure and the second chip stacking structure are arranged side by side on the first semiconductor chip in a first direction, the first chip stacking structure and the second chip stacking structure each comprises a plurality of second semiconductor chips that are successively stacked in the first direction, a plurality of second conductive bumps are formed on a side of each of the first chip stacking structure and the second chip stacking structure that is away from each other in the first direction, and the first direction is a direction parallel to a plane where the first base plate is located; and a plurality of second base plates, wherein a signal line in each of the plurality of second base plates is connected to the plurality of second conductive bumps, and the plurality of second base plates are connected to the first base plate in a direction perpendicular to the plane where the first base plate is located;

wherein the first semiconductor chip is located on the first base plate; the first semiconductor chip is connected to the first base plate by means of first conductive bumps; and each second base plate is connected to the first base plate by means of third conductive bumps.

2. The semiconductor package structure of claim 1, wherein the first semiconductor chip comprises a logic die, and the second semiconductor chip stacking structure comprises a dynamic random access memory (DRAM) die.

3. The semiconductor package structure of claim 1, further comprising:

an adhesive film, located between the first semiconductor chip and the second semiconductor chip stacking structure and located between the first chip stacking structure and the second chip stacking structure.

4. The semiconductor package structure of claim 3, wherein the adhesive film comprises a first adhesive film and a second adhesive film located on the first adhesive film; an elastic modulus of the second adhesive film being greater than an elastic modulus of the first adhesive film.

5. The semiconductor package structure of claim 1, wherein the first semiconductor chip wirelessly communicates with the second semiconductor chip stacking structure.

6. The semiconductor package structure of claim 1, wherein a groove is formed in the first base plate; the first semiconductor chip is located in the groove;

the first semiconductor chip is connected to the first base plate by means of first conductive bumps;

and each the second base plate is connected to the first base plate by means of third conductive bumps.

7. The semiconductor package structure of claim 1, further comprising:

a plurality of Through Silicon Vias (TSV), penetrating the plurality of second semiconductor chips in the first direction; and a plurality of fourth conductive bumps, each fourth conductive bump being located between two adjacent second semiconductor chips and the plurality of fourth conductive bumps being correspondingly connected to the TSVs, wherein each of the plurality of second conductive bumps is connected to respective TSVs and respective fourth conductive bumps.

8. The semiconductor package structure of claim 1, wherein the signal line comprises a ground line and a power line; each second conductive bump comprises a first conductive sub-bump and a second conductive sub-bump; and the ground line is electrically connected to the first conductive sub-bump, and the power line is electrically connected to the second conductive sub-bump.

9. The semiconductor package structure of claim 8, wherein at least one first conductive sub-bump is spaced between any two adjacent second conductive sub-bumps;

and a plurality of first conductive sub-bumps surrounds the second conductive sub-bump.

10. The semiconductor package structure of claim 1, further comprising:

a filling layer at least one of located between the second semiconductor chip stacking structure and each of the plurality of second base plates or located between the first semiconductor chip and the first base plate.

11. The semiconductor package structure of claim 10, further comprising:

a package compound structure, located on the first base plate, wherein the package compound structure at least wraps the second semiconductor chip stacking structure and the plurality of second base plates;

wherein a Young's modulus of the filling layer is greater than a Young's modulus of the package compound structure.

12. A method for manufacturing a semiconductor package structure, the method comprising:

forming a second semiconductor chip stacking structure, wherein the second semiconductor chip stacking structure comprises at least one first chip stacking structure and at least one second chip stacking structure, the first chip stacking structure and the second chip stacking structure each comprises a plurality of second semiconductor chips that are successively stacked, and a plurality of second conductive bumps are formed on a side of each of the first chip stacking structure and the second chip stacking structure in a stacking direction;

forming a first semiconductor chip;

oppositely disposing surfaces of the first chip stacking structure and the second chip stacking structure that are away from the plurality of second conductive bumps in the stacking direction, and connecting surfaces of the first chip stacking structure and the second chip stacking structure that are perpendicular to the stacking direction to a surface of the first semiconductor chip;

providing a plurality of second base plates, wherein each second base plate is located, in the stacking direction, on a side of each of the first chip stacking structure and the second chip stacking structure on which second conductive bumps are formed, and a signal line in each second base plate is connected to the plurality of second conductive bumps; and providing a first base plate, connecting the first semiconductor chip and the first base plate, and connecting the plurality of second base plates to the first base plate;

wherein the providing a plurality of second base plates comprises:

cutting each of the plurality of second base plates to form third conductive bumps on the second base plate, to cause a surface of the second base plate on which the third conductive bumps are formed to be flush with a surface of the second semiconductor chip stacking structure that is close to the first semiconductor chip.

13. The method of claim 12, wherein the forming a second semiconductor chip stacking structure comprises:

forming, in the stacking direction, a plurality of Through Silicon Vias (TSV) penetrating the plurality of second semiconductor chips;

forming a plurality of fourth conductive bumps, each fourth conductive bump being located between two adjacent second semiconductor chips, and the plurality of fourth conductive bumps being correspondingly connected to the plurality of TSVs;

connecting the plurality of second semiconductor chips by means of hybrid bonding to form a second semiconductor chip stacking body; and forming the second semiconductor chip stacking body into a plurality of second semiconductor chip stacking structures.

14. The method of claim 12, wherein the method further comprises:

forming a groove in the first base plate; and placing the first semiconductor chip in the groove.

15. The method of claim 12, further comprising:

forming an adhesive film, and by means of the adhesive film, connecting the second semiconductor chip stacking structure and the first semiconductor chip, and connecting the first chip stacking structure and the second chip stacking structure.

16. The method of claim 12, wherein the first semiconductor chip wirelessly communicates with the second semiconductor chip stacking structure.

17. The method of claim 12, further comprising:

forming a filling layer, wherein the filling layer is at least one of located between the second semiconductor chip stacking structure and each of the plurality of second base plates or located between the first semiconductor chip and the first base plate.

18. The method of claim 17, further comprising:

forming a package compound structure on the first base plate, wherein the package compound structure at least wraps the second semiconductor chip stacking structure and the plurality of second base plates;

wherein a Young's modulus of the filling layer is greater than a Young's modulus of the package compound structure.

* * * * *